United States Patent [19]
Herzer et al.

[11] Patent Number: 6,072,214
[45] Date of Patent: Jun. 6, 2000

[54] IGBT WITH TRENCH GATE STRUCTURE

[75] Inventors: Reinhard Herzer, Ilmenau; Mario Netzel, Braunsbedra, both of Germany

[73] Assignee: Semikron Elektronik GmbH, Germany

[21] Appl. No.: 08/985,761

[22] Filed: Dec. 5, 1997

[30] Foreign Application Priority Data

Dec. 6, 1996 [DE] Germany ............... 196 50 599
Feb. 12, 1997 [DE] Germany ............... 197 05 276

[51] Int. Cl.[7] ............... H01L 29/745; H01L 29/78
[52] U.S. Cl. ............... 257/331; 257/139; 257/140; 257/147; 257/378; 257/341
[58] Field of Search ............... 257/147, 139, 257/140, 341, 378, 331

[56] References Cited

U.S. PATENT DOCUMENTS 4,827,321  5/1989  Baliga ............... 257/147
5,714,775  2/1998  Inoue ............... 257/139
5,814,858  9/1998  Williams ............... 257/341

*Primary Examiner*—Jerome Jackson, Jr.
*Attorney, Agent, or Firm*—Morrison Law Firm

[57] ABSTRACT

An IGBT includes two trenches extending from an emitter terminal toward a first side of a substrate of a first conductivity material. A collector layer of a second conductivity material is disposed on a second side of the substrate. The trenches each have a gate and a insulator within them. On the outside of the trenches, bulk regions of a second conductivity type are disposed on the first side of the substrate. On top of the bulk regions are bulk connection regions of a second conductivity type and source regions of a first conductivity type. The emitter couples the bulk and source regions. A material of either conductivity type, an insulator, or two MOSFETS are placed between the trenches. With multiple IGBTs, the trenches can be arranged in striped, island-like, or lattice format.

14 Claims, 10 Drawing Sheets

IGBT WITH TRENCH GATE STRUCTURE

BACKGROUND OF THE INVENTION

The invention describes an IGBT (Insulated Gate Bipolar Transistor) with a trench gate structure. IGBTs with trench gate structure have recently become known in the art. Trench structures in general are used to a large extent in the fabrication of storage cells for highly-integrated storage circuits. Also known are power semiconductor components with trench structures, which in particular have been used for some time to realize the gate complex. For example, vertical DMOS transistors (double-diffused MOS transistors) are used for a lower voltage range (<100 V).

For these trench MOS transistors, narrow trenches are used with low vertical depths, such as about 1.5 µm in depth and about 1.5 µm in width for a 50 V MOSFET. A high density of these trench structures is desirable, so that a high canal width per surface unit can be achieved. The fabrication of the trench gate complex for these trench MOS transistors is taught in EP 0698 919 A2. Also desirable is low Miller capacitance and small forward voltage because IGBTs are frequently used in high frequency applications.

The technical background of trench technology will first be described in detail referring to an issued United States patent, since trench gate structures have also been suggested and used for IGBT (IEDM, Techn. Digest, pp. 674–677, 1987).

FIG. 1 shows an unscaled cross-sectional view of a MOS transistor with a trench structure according to the prior art. A distinction is usually made between a non-punch-through IGBT structure shown in FIG. 1 and a punch-through IGBT. The non-punch-through IGBT is characterized by a thick n⁻substrate 1 and a thin p layer 12, implanted on the backside, as a collector of the overall component, as shown in FIG. 1. The punch-through version (not shown) is characterized by a p⁺substrate to which a first n-doped intermediate layer and a second lower-doped epitaxically segregated n⁻ layer have been fitted.

The cell structure on the top side of the wafer is the same for both types. It consists of p bulk region 2, n⁺source regions 3 and p⁺bulk connection regions 4 which are interrupted by vertical etching trenches 5 in the form of stripes or lattices as will be discussed more fully below. These trench structures 5 are provided on all sides with gate insulator 6, filled with polysilicon gate 7 and covered at the top with passivation layer 8 and aluminum 9.

Polysilicon gate 7, gate insulator 6 and p region 2 form a MOS condenser of the internal MOSFET whose channel 11 forms between n⁺source region 3 and n⁻substrate 1 vertically along the side wall of trench 5. The trench gate structures are connected with each other to form joint gate connection 15.

N⁺source regions 3 and p⁺bulk connection regions of all cells thus formed are connected to each other with aluminum metallization 9. The metallization constitutes the emitter 14 of the IGBT. The entire structure, with the exception of the bond surfaces, is covered with passivation layer 10. The collector 16 of the IGBT is formed by further metallization 13 on the backside of the wafer.

In the relevant sector of power electronics, prior art contains the problems involved in the application of trenches for thyristors with turn-off capability in MOS technology.

In U.S. Pat. No. 5,329,142, the disclosure of which is hereby incorporated by reference, the semiconductor problems in IEGT technology for MOS-controlled thyristors are described in great detail and very conscientiously. Multiple trench structures are shown. Those structures are a prerequisite for the reinforcement in thyristor technology in high-tension loads when one wishes to achieve small conducting-stage voltages. That is the only way to achieve a massive increase in the effect of electron injection in thyristor technology.

The patent describes in detail the MOS thyristor structure with two switchable states. A p⁺region is formed on an n⁺region, both of which are connected to a cathode. A p⁺region is formed below these two regions such that it is not connected to the cathode. The p⁻region is located above an n⁻region. All of these regions are adjacent to an isolated trench gate construction. This structure results in a vertical MOS thyristor with turn-off capability. A vertical n channel transistor is formed with the n⁺region, p⁻region, n⁻region and the trench gate. The n channel MOSFET is turned on at positive gate voltage (the turn-on transistor of the thyristor). The structure also forms a vertical p channel transistor with the p⁺region, n⁺region, p⁻region, n⁻region and the trench gate. The p channel MOSFET is switched on at negative gate voltage (the turn-off transistor of the thyristor).

Due to the large gate surfaces, the Miller capacitance increases considerably, which leads to higher switching losses. In circuits with thyristor drives, this fact matters little since small operating frequencies are used, and the advantage of minimum forward voltages has priority.

The disclosures of the prior art could not be used, however, to solve the present problem with the use of an IGBT. This is because small forward voltages as well as a comparatively small Miller capacitance are required to achieve a better compromise between forward voltage and switching losses when dealing with higher operating frequencies.

The following references show solutions using an IEGT structure and thus are not relevant to the objective of the present invention which relates to an IGBT:

U.S. Pat. No. 5,448,083;

Mitsuhiko Kitagawa et al: "4500 V IEGTs having Switching Characteristics Superior to GTO" in Proceedings of 1995 International Symposium on Power Semiconductor Devices & ICs, Yokahama, pp. 486–490, and Mitsuhiko Kitagawa et al: "A 4500 V Injection-Enhanced Insulated Gate Bipolar Transistor . . . " in JEDM (1993), pp. 679–682.

Other solutions, such as those in DE 43 24 481 A1 relate to a purely marginal structure of IGBT.

Mitsubishi (Proc. ISPSD '94, pp.411–416, Davos, 1994) was derived from trench MOSFET structures and introduced trench gates with a depth of 3 µm and a width of 1 µm for a 600 V IGBT. The distance of the stripe-shaped trenches varied between 3.5 µm and 14 µm. For shorter distances, a high density of the trench structures is achieved as well in these trench IGBTs (TIGBT).

In comparison with an IGBT with planar gate, TIGBT of this kind achieve a clearly reduced forward voltage. This reduction is achieved primarily through the low channel resistance due to the large channel width per surface unit. However, there is a disadvantage that due to the large channel width, the saturation voltage level is several times higher than in an IGBT with planar gate. This considerably shortens the time period in which the component can withstand a short circuit without being destroyed.

Most recently, further improvements and changes of the trench gate complex have been suggested. Thus, a deepening of the trench gate, for example from 3 µm to 5 µm or 9 µm further lowers the forward voltage. However, the corners of these narrow and deep structures are considerably stressed when blocking voltage is applied, which leads to a reduction in the static barrier capacity and the avalanche resistance in case of dynamic stress.

However, an improved compromise for all important parameters is achieved when the trench gate complex is made very wide. In this case, wide means that the trench width becomes several times the trench depth. Such structures were introduced in the Colloquium "Semiconductor Components and the Material Quality of Silicon", Freiburg, 1995, and in ISPSD, Yokohama, 1995, pp. 224–229.

In FIG. 2 wide trench structures 5 are provided with gate insulator 6, completely filled with polysilicon gate 7 and covered at the top with passivation layer 8 and aluminum 9. Analogous to FIG. 1, between wide trench gate structures 5 arranged in stripes or lattices, p bulk regions 2, n$^+$source regions 3 and p$^+$bulk connection regions 4 are disposed.

The enlarged trench width results in large cells, and thus the channel width per surface unit is considerably smaller than that of the structure in FIG. 1. Although this increases the channel resistance of the internal MOSFET, a smaller forward voltage is achieved for the overall component with a trench depth that is only slightly larger than the penetration depth of the P bulk region than with narrow and very deep structures. Due to the reduced channel width, the saturation voltage level is considerably reduced and lies in the range of the values for IGBT with planar gate. Stress on the trench corners in case of blocking voltage is also considerably lower in comparison with narrow and deep trenches.

However, no practical applications for a TIGBT with a wide trench gate complex are known. In particular the filling and planarization of the trench is not easily achievable with conventional pure segregation methods. This requires combinations of segregation methods and mechanical/chemical planarization methods. Furthermore, as the gate surface is enlarged, the so-called Miller capacitance increases. Knowledge concerning the function and characteristics of IGBT with such a trench gate complex is part of the prior art.

OBJECTS AND SUMMARY OF THE INVENTION

It is an object of this invention to overcome the drawbacks of the prior art.

It is another object of the present invention to provide a semiconductor element with a power IGBT which reduces the amount of switching losses found in the prior art.

It is a further object of the present invention to provide a semiconductor element with a power IGBT which has a reduced Miller capacitance effect.

It is a still further object of the present invention to provide a semiconductor element with a power IGBT with a relatively small forward voltage, a high blocking voltage, and small saturation voltage.

It is still yet another object of the present invention to provide a semiconductor device with an IGBT which reproduces the effects of a wide trench gate by using two narrow trench gates.

Briefly stated, in a semiconductor device with an IGBT, two trenches extend from an emitter terminal toward a first side of a substrate of a first conductivity material. A collector layer of a second conductivity material is disposed on a second side of the substrate. The trenches each have a gate and a insulator within them. On the outside of the trenches, bulk regions of a second conductivity type are disposed on the first side of the substrate. On top of the bulk regions are bulk connection regions of a second conductivity type and source regions of a first conductivity type. The emitter couples the bulk and source regions. A material of either conductivity type, an insulator, or two MOSFETS are placed between the trenches.

According to another embodiment of the invention a semiconductor device with an IGBT includes a substrate region of a first conductivity type having first and second opposing sides, an emitter terminal, and two trenches extending from said emitter terminal toward said first side of said substrate. Each trench has a gate and an insulator disposed around said gate. The trenches each have first and second opposing sides. The trenches define a cavity between said first sides of said trenches filled with an insulator. A collector region of a second conductivity type is disposed on said second side of said substrate. Two bulk regions of said second conductivity type are disposed on said first side of said substrate and further disposed on said second sides of each of said trenches. Two source regions of said first conductivity type are disposed on said bulk regions and further disposed on said second sides of each of said trenches. Two bulk connection regions of said second conductivity type are each disposed on a respective bulk region and further disposed adjacent to a respective source region. The source and bulk connection regions are electrically connected through said emitter terminal.

According to another embodiment of the present invention, an IGBT includes a substrate region of a first conductivity type having a first and second side opposing one another, an emitter terminal, and two trenches extending from said emitter terminal toward said first side of said substrate. Each trench has a gate and an insulator disposed around said gate. The trenches have first and second opposing sides. Said trenches define a cavity between said first sides of said trenches filled with a material of a second conductivity type. A collector region of said second conductivity type is disposed on said second side of said substrate. Two bulk regions of said second conductivity type are disposed on said first side of said substrate and further disposed on said second sides of each of said trenches. Two source regions of said first conductivity type are each disposed on a respective bulk region and each is further disposed on respective second sides of each of said trenches. Two bulk connection regions of said second conductivity type are each disposed on a respective bulk region and further disposed adjacent to a respective source region. The source and bulk connection regions are electrically connected through said emitter terminal.

According to yet another embodiment of the invention, an IGBT includes a substrate region of a first conductivity type having first and second opposing sides, an emitter terminal, and two trenches extending from said emitter terminal toward said first side of said substrate. Each trench has a gate and an insulator disposed around said gate. The trenches have first and second opposing sides. Said trenches define a cavity between said first sides of said trenches. The cavity includes at least one source region of a second conductivity type disposed upon said first side of said substrate, at least one tub of said first conductivity type disposed upon said source, and at least one drain of said second conductivity type disposed upon said tub. The tub and the drain are electrically connected through a metallization material. Two bulk regions of said second conductivity type are disposed on said first side of said substrate and are further disposed on said second sides of each of said trenches. A collector region of said second conductivity type is disposed on said second side of said substrate. Two bulk connection regions of said second conductivity type are each disposed on a respective bulk region and further disposed adjacent to a respective source region. Two source regions of said first conductivity type are each disposed on a respective bulk region and each is further disposed on respective second sides of each of said trenches. The source and bulk connection regions are electrically connected through said emitter terminal.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
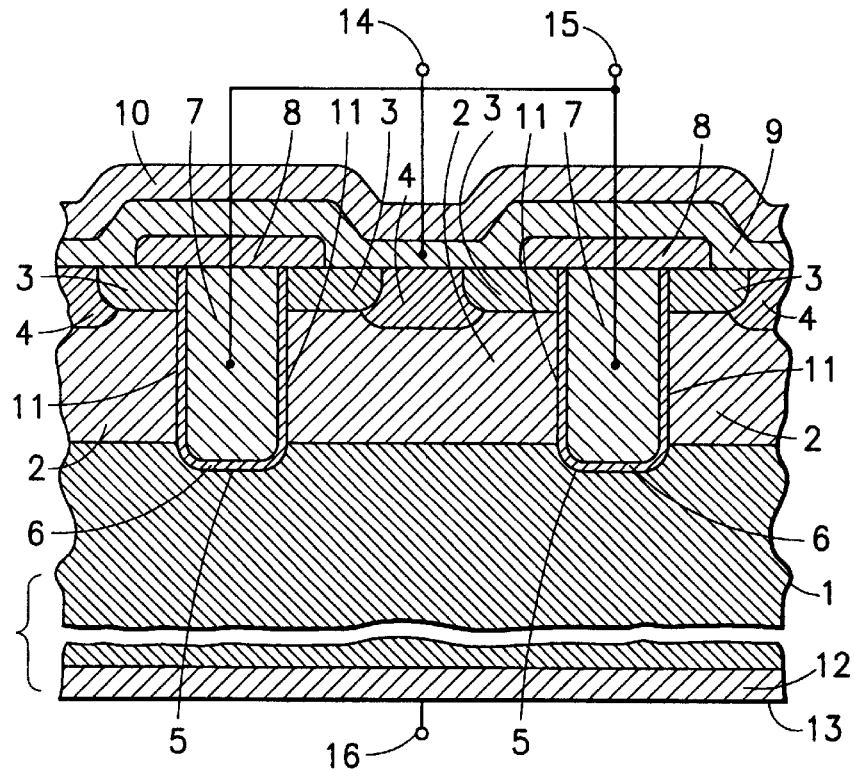
FIG. 1 shows an already described arrangement according to the prior art.
Figure 2:
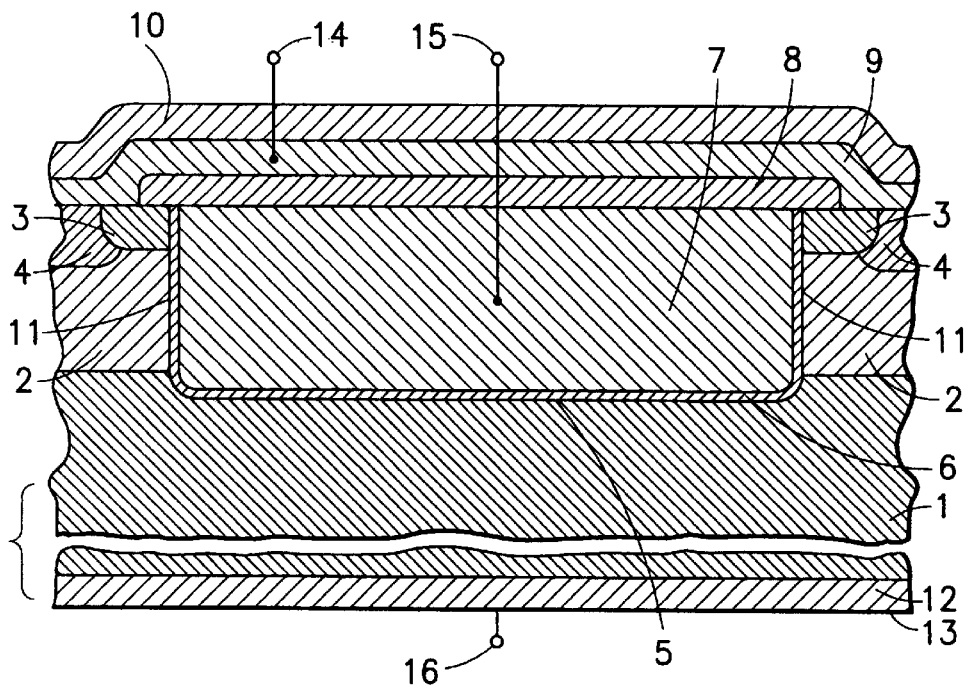
FIG. 2 shows another version of an arrangement according to the prior art.

The nexus for the present invention stems from the prior art shown in FIGS. 1 and 2. Thus, like reference numerals depict the same elements as in the prior art. Referring to FIG. 2, the distance between narrow trench gate structures ("trenches") 5 corresponds to the most favorable width of the trench gate complex in FIG. 1. In contrast to the prior art, vertical MOS channel 11 is produced only at respective outside surfaces of narrow trench gate structures 5

Between trenches 5 is substrate material 1. Trenches 5 are provided on all sides with gate insulator 6, they are filled completely with polysilicon gate 7 and they are covered at the top with passivation layer 8 and aluminum 9. On one side of trench gate structures 5, p bulk regions 2, n⁺source regions 3 and p⁺bulk connection regions 4, are arranged in alternating order and in the form of stripes or lattices. On another side of trenches 5 is substrate region 1.

With this structure, equal forward voltages and saturation currents are achieved, as with the structure shown in FIG. 2. In comparison with the structure in FIG. 2, however, the simpler technological solution is an advantage over the prior art especially in etching and filling the narrow trench. However, this embodiment results in a nonhomogeneous charge carrier distribution in ⁻region 1 between trenches 5, which has a detrimental effect on the dynamic characteristics of the component. By realizing the further inventive idea as described below, the Miller capacitance can be lowered thus decreasing the switching losses, and improving the homogeneity of the charge carrier distribution can be improved.

A possible solution consists in removing vertical portions or all of n⁻substrate region 1 between trench structures 5 and replacing this with a thick insulation region. The thickness of the insulator is chosen so that one end of the insulator lies at or about the same level as where the formal substrate was.

Figure 4:
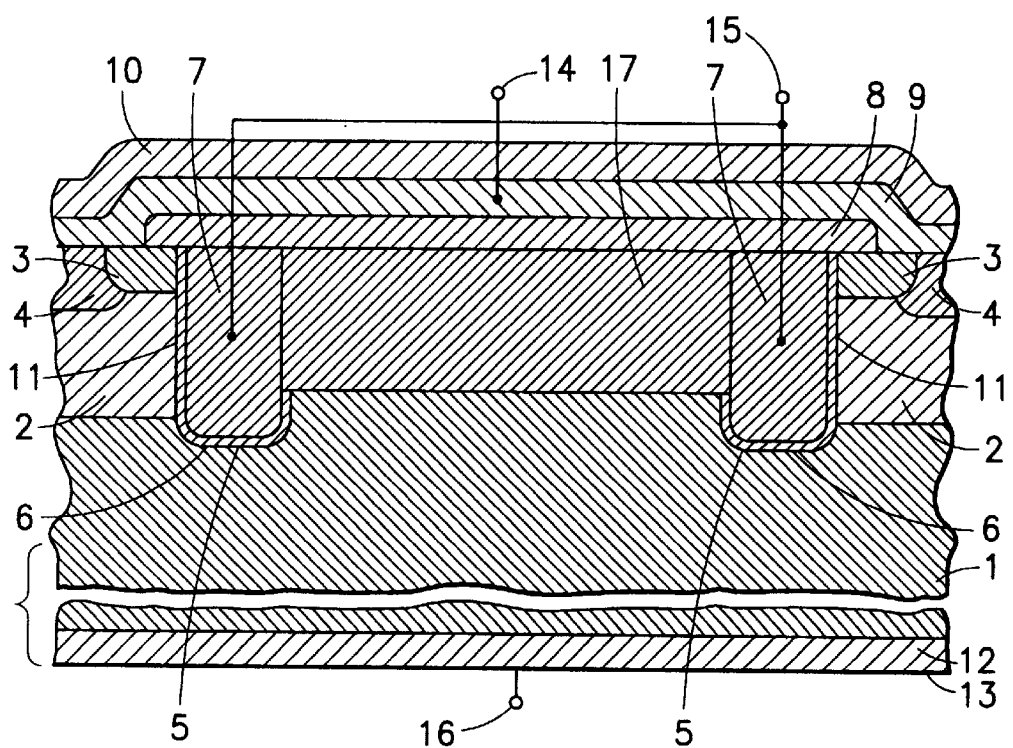
FIG. 4 is a cross-sectional view of a second embodiment of the present invention.

FIG. 4 depicts such a possibility. It, too, shows an IGBT cell structure. In this embodiment of the invention, the upper limit of insulator 17 lies at the level of the former substrate surface, and substrate region 1 between trench structures 5 is almost completely removed. Trench structures 5 are all provided with gate insulator 6 on all sides, they are completely filled with polysilicon gate 7 and covered at the top with passivation layer 8 and aluminum 9.

On one side of trench gate structures 5 p bulk region 2, n⁺source region 3 and p⁺bulk connection region 4 are arranged in alternating order in the form of stripes or lattices. On another side of trench gate structures 5 lies insulator region 17.

The thicker one makes insulator region 17, the lower the Miller capacitance becomes, and the homogeneity of the charge carrier distribution improves. However, in the event of a blocking voltage, the stress of the trench corners on the side of insulator region 17 increases.

Figure 5:
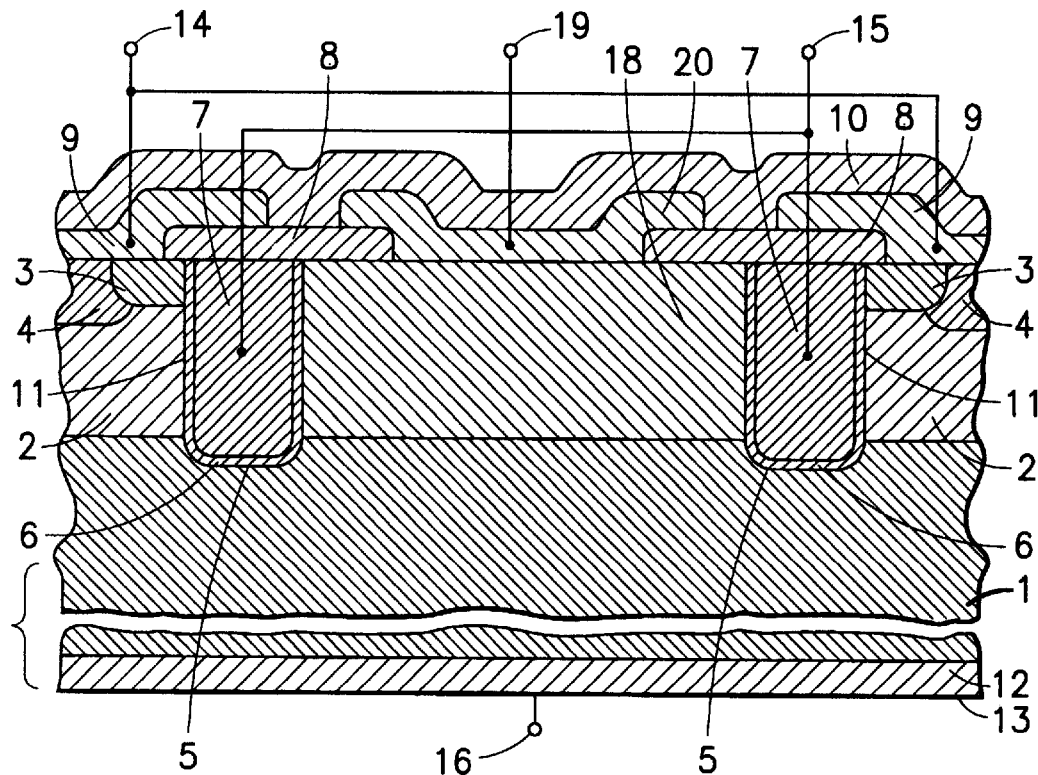
FIG. 5 is a cross-sectional view of a third embodiment of the present invention.

FIG. 5 shows a way of solving the remaining problem. The idea is to insert p region 18 instead of insulator region (17 in FIG. 4). P region 18 has a lower or equal penetration depth in relation to p bulk region 2.

Alternatively, the penetration depth of p region 18 can be chosen so that the inner corners of trench structure 5 are enclosed. Trench structures 5 again are all provided with a gate insulator 6, they are all completely filled with polysilicon gate 7 and covered at the top passivation layer 8 and aluminum 9.

On one side of trench gate structures 5 is p bulk region 2, n⁺source region 3 and p⁺bulk connection region 4, in alternating order and in the form of stripes or lattices. On another side of trenches 5 lies p region 18.

In the electrical sense, the p region can be floating on one side in which case connection 19 is not necessary. Or an external potential can be connected to p region 18 directly through connection 19 and metallization 20 or with additional elements. Additional elements can consist of, for example, a rigid resistance, a controlled resistance, or an external or integrated electronic circuit.

In one possible arrangement, the vertical MOS structures on one side of trenches 5 alternate with p regions 18, substrate regions 1, or insulation regions 17 on the other side of trenches 5; this cell repetition structure is binding.

Figure 3:
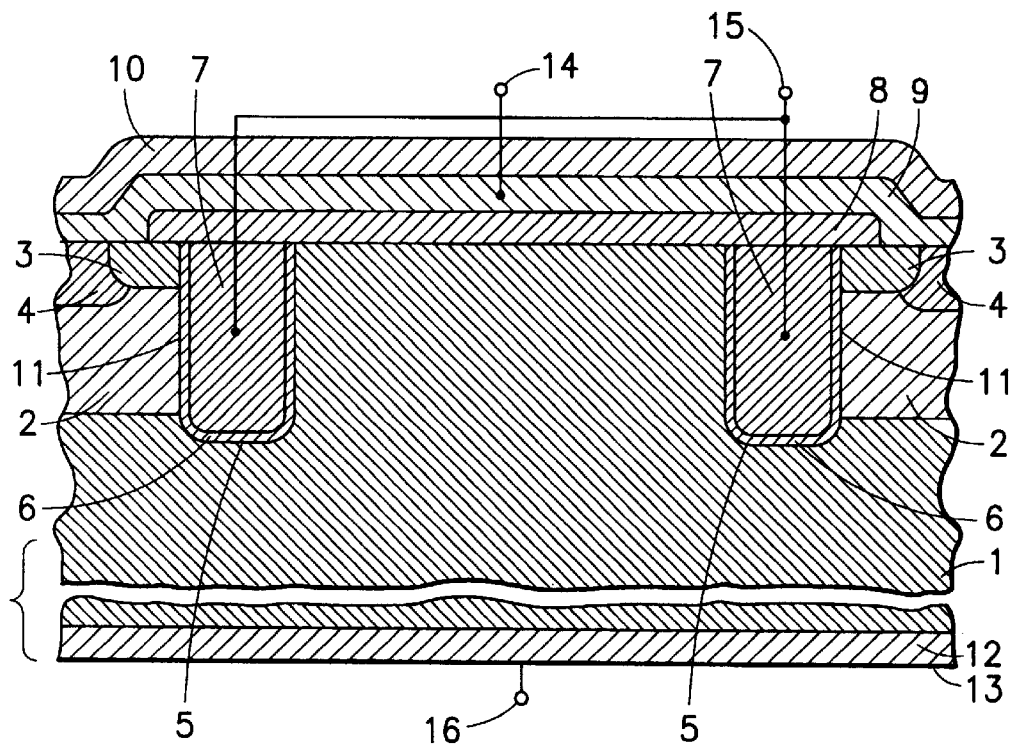
FIG. 3 is a cross-sectional view of a first embodiment of the present invention.

With the structure according to FIG. 5 it is possible to achieve forward voltages which are just as low as those achieved with the structure shown in FIGS. 2 to 4 above. However, the Miller capacitance is reduced, and the switching losses are therefore lowered. Furthermore, due to inserted p region 18 there is protection against undesirable avalanche generation in case of a blocking stress at corners of trenches 5 on the side of p region 18. Here, the greatest effectiveness is achieved by enclosing these corners with the additional p region 18.

Figure 6:
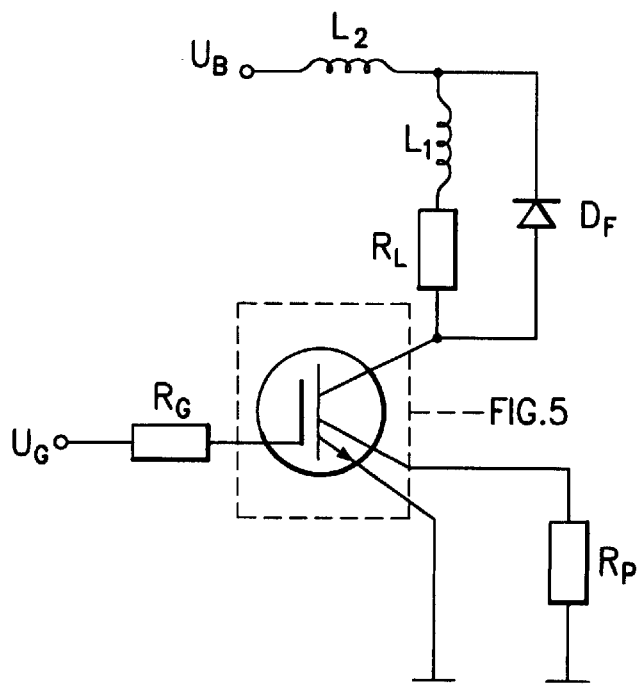
FIG. 6 shows an example of possible external circuitry for the embodiment shown in FIG. 5.

FIG. 6 shows an example for possible external circuitry for the embodiment depicted in FIG. 5. Sketched is the basic circuit which shows how p region 18 can be connected directly to an external potential or with additional components, such as resistance $R_p$, to emitter 14. Also shown are free-running diode $D_F$, load $L_1$ and $R_L$, and leakage inductance $L_2$. Leakage inductance $L_2$ combines all parasitic wiring inductances.

Figure 7:
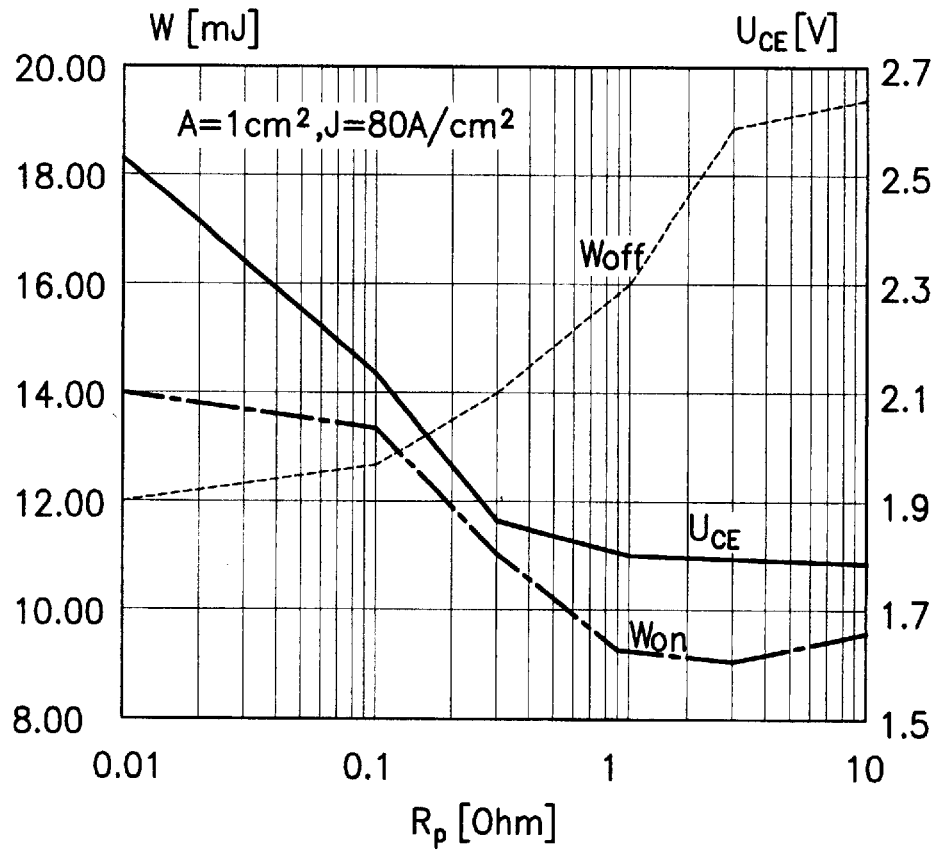
FIG. 7 shows the electrical effects of the embodiment in FIG. 5.

FIG. 7 shows the electric effect of the circuitry according to FIG. 6 using the example of a 1200 V IGBT (structure according to FIG. 5, current density 80 A/cm$^2$, chip surface 1 cm$^2$ in the switch operation. As is shown, the value of the three most significant loss portions, turn-on losses $W_{on}$, turn-off losses $W_{off}$, and forward voltage $U_{CE}$ change when resistance $R_p$ is varied between p region 18 and emitter 14 in the limits of 0.01 to 10 Ohm. Thus there is an effect on the losses of the entire component due to p region 18 and its external circuitry.

It can also be concluded from FIG. 7 that by connecting a controlled resistance to p region 18, a further improvement of the electrical characteristics is achieved. Thus a certain resistance value during turn-off has the result of reducing the turn-off losses and enhancing the ruggedness, while a different resistance value during turn-on minimizes the turn-on losses and causes a lower forward voltage. The resistance can be controlled with an electronic circuit as is shown in FIG. 8.

Figure 8:
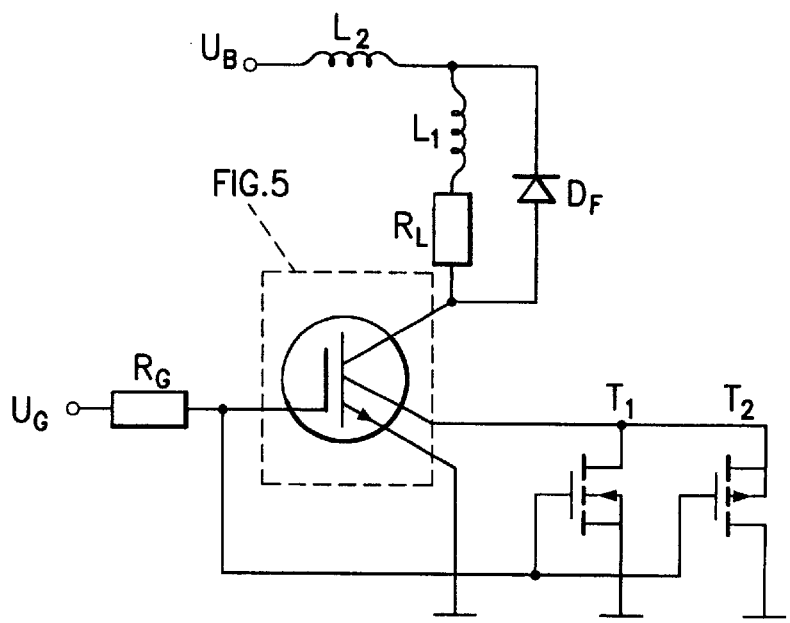
FIG. 8 shows another example of a circuit arrangement according to the embodiment in FIG. 5.

In FIG. 8 variable resistance $R_p$ from FIG. 6 is realized through parallel-switching n and p channel MOSFETs T1, T$_2$ between p region 18 and emitter 14. The $R_{on}$ of these transistors corresponds to the optimal values for turning on and off the IGBT. The gates of T1 and T1 are connected with the IGBT gate.

Figure 9:
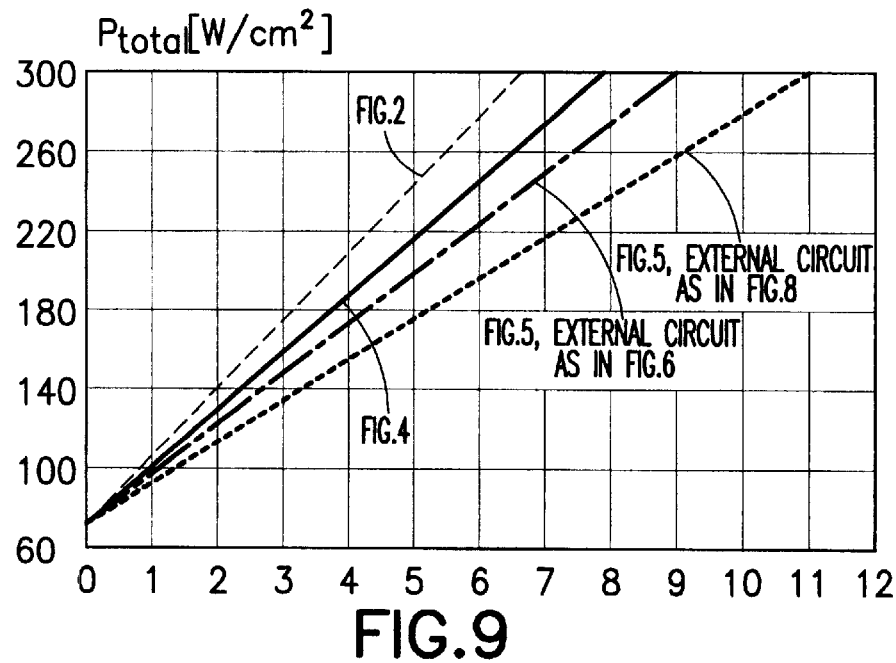
FIG. 9 shows the overall losses of different trench gate structures as a function of the switching frequency.

FIG. 9 shows the overall losses of different trench gate structures as a function of the switching frequency. It shows the mean power dissipation as a function of the switching frequency for the structures in FIG. 2 and 4 as well as the structure in FIG. 5 for both external circuits shown in FIG. 6 and FIG. 8. While all 4 versions have basically the same static forward loss $U_{CE}$, the reduced overall losses $P_{total}$ are an expression of the lower circuit losses due to the inventive measures in the structures of FIG. 4 and 5 when compared with the initial structures according to the state of the art in FIG. 2.

Figure 10:
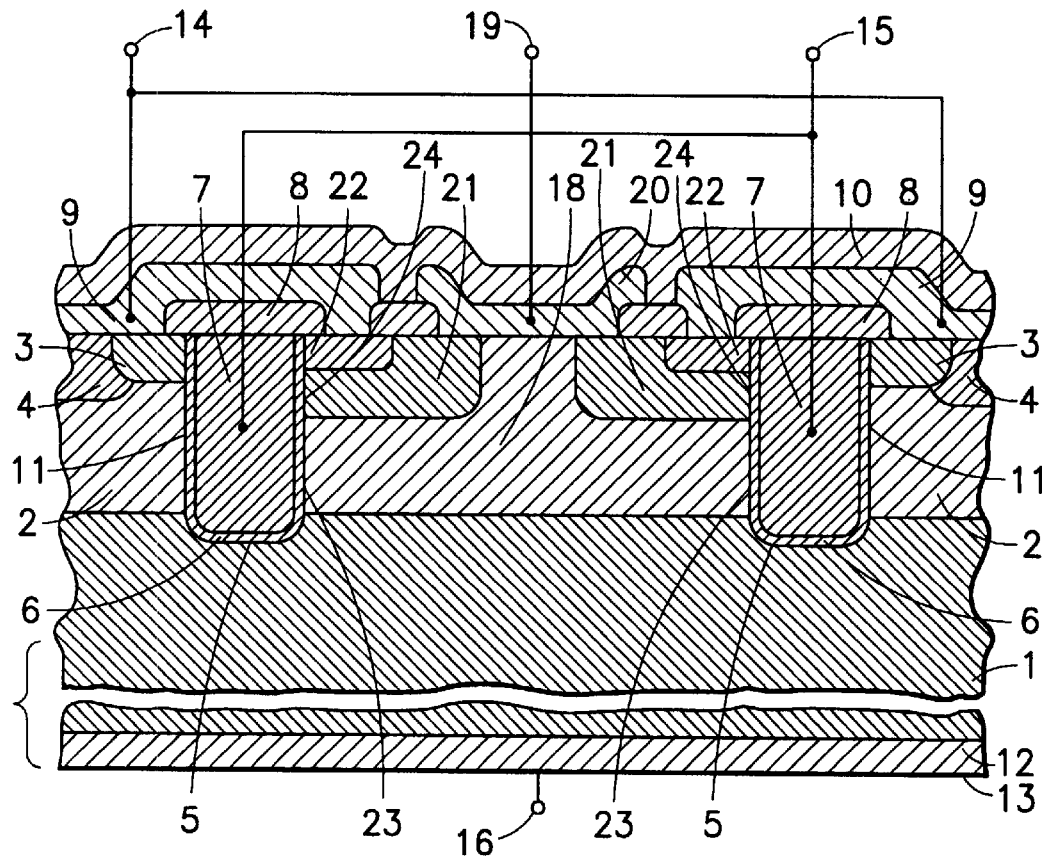
FIG. 10 is a cross-sectional view of a fourth embodiment showing integration of components in the p region.

FIG. 10 shows an example for the integration of components in p region 18. The functional task of such components or circuits can be to improve the electric parameters of the IGBT or to control and monitor their operation in circuit arrangements.

P region 18 can have a lower or a similar penetration depth in comparison with p bulk region 2. The penetration depth can also be chosen so that the inner corners of trenches 5 are surrounded. Elements in FIG. 10 with similar reference designators as in the previous figures correspond to the same items and thus description of them is omitted.

In p region 18 itself, one vertical pMOS transistor is arranged at each side of the limiting trench structure and is formed by p$^+$drain regions 22, n tub (21, bulk) and p region (18, source). The pMOS transistor is controlled via the gate structure of trench 5, including gate insulator 6 and polysilicon gate 7.

P$^+$drain region 22 of the pMOS transistor is short-circuited through aluminum 9 with emitter 14. P source region 18 and n bulk region 21 of the pMOS transistor are short-circuited via the metallization 20 which, analogous to that in FIG. 5, is led outside the device through connection 19. Connection 19 can be floating or connected directly to an external potential with or without additional elements. Additional elements can consist of a rigid resistance, a controlled resistance or an external or integrated circuit.

Through the integration of the pMOS transistor, a parasitic nMOS transistor is formed which consists of n tub region 21 as the source, p region 18 as the bulk and n$^-$substrate region 1 as the drain. The nMOS transistor is also controlled via the gate structure of trench 5.

In principle, it is also possible not to electrically connect n bulk region 21 with p region 18 and so let n bulk region 21 float. In such a version, the parasitic nMOS transistor cannot carry a current (source is not connected). A disadvantage of this is that parasitic bipolar or thyristor structures would result.

Figure 11:
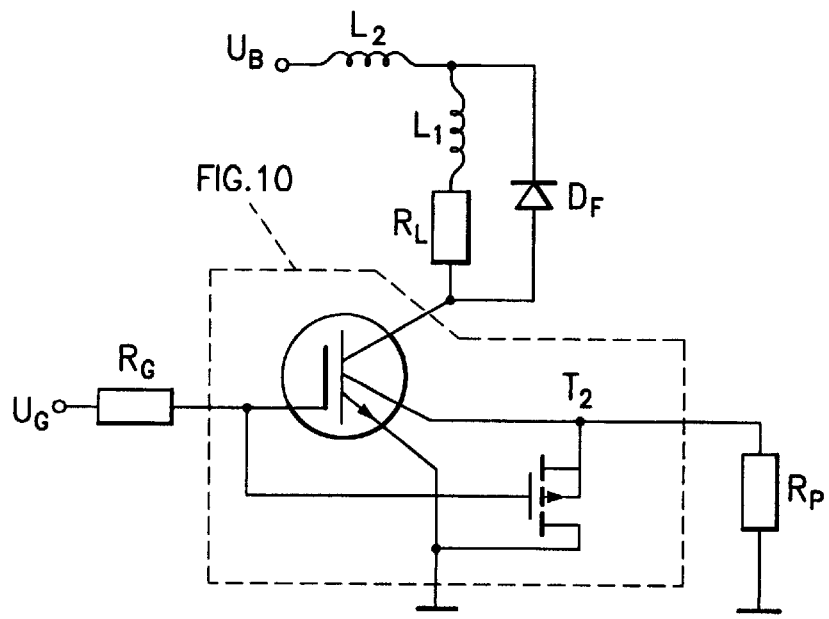
FIG. 11 shows a potential circuitry of the IGBT structure according to the embodiment in FIG. 10.

FIG. 11 shows a potential circuitry for the IGBT structure according to FIG. 10, where a rigid resistance $R_p$ is switched between the connection of p region 18 and emitter 14. Other common elements of external circuitry are free-running diode $D_F$, leakage inductance $L_2$ and load $L_1$ and $R_L$.

The resistance value for $R_p$ must be chosen so that the result is minimum turn-on losses and a low forward voltage as shown in FIG. 7. The resistance value is also set so that the parasitic nMOS transistor cannot carry a high current through negative feedback at the source because that would cause changes that would be detrimental to the electrical characteristics of the total structure.

By arranging the pMOS transistor as a parallel-switched repeat structure, a large channel width and thus a low turn-on resistance for the pMOS transistor is achieved. Penetration depth and doping of p region 18 and n tub 21 must be chosen and matched so that the punch-through reserve in the p region and thus the blocking capacity of the overall component is ensured and the threshold voltage of the pMOS transistor lies at negative voltages (for example −3 V).

If a positive voltage is applied at polysilicon gate 7, e.g. +15 V opposite emitter 14, vertical n channel 11 is formed on one side of trench 5 and the IGBT is turned on, while vertical p channel 24 of the pMOS transistor is blocking on the other side of trench 5. If a negative voltage is applied at polysilicon gate 7, e.g. −15 V opposite emitter 14, vertical n channel 11 and thus the IGBT are blocked, while vertical p channel 24 is formed and the pMOS transistor is turned on. A hole current from the n$^-$region 1 of the IGBT can flow over enrichment layer 23 and p channel 24 to p$^+$drain 22 of the pMOS transistor which in turn is connected via metallization 9 with emitter 14. In such a case, resistance $R_p$ parallel to the pMOS transistor barely contributes to the current flow due to the higher resistance value.

With the structure introduced in FIG. 10 and its circuitry according to FIG. 11, the resistance between p region 18 and emitter 14 is automatically controlled via the trench gate voltage so that when the IGBT is turned on, the high-impedance resistance $R_p$ becomes effective. But, the low-impedance pMOS transistor becomes a conductor when the IGBT is turned off, and that accelerates the evacuation of the holes from n⁻region 1. This has an advantageous effect on the switching losses, as already described and shown with reference to FIG. 7 and 9.

Figure 12:
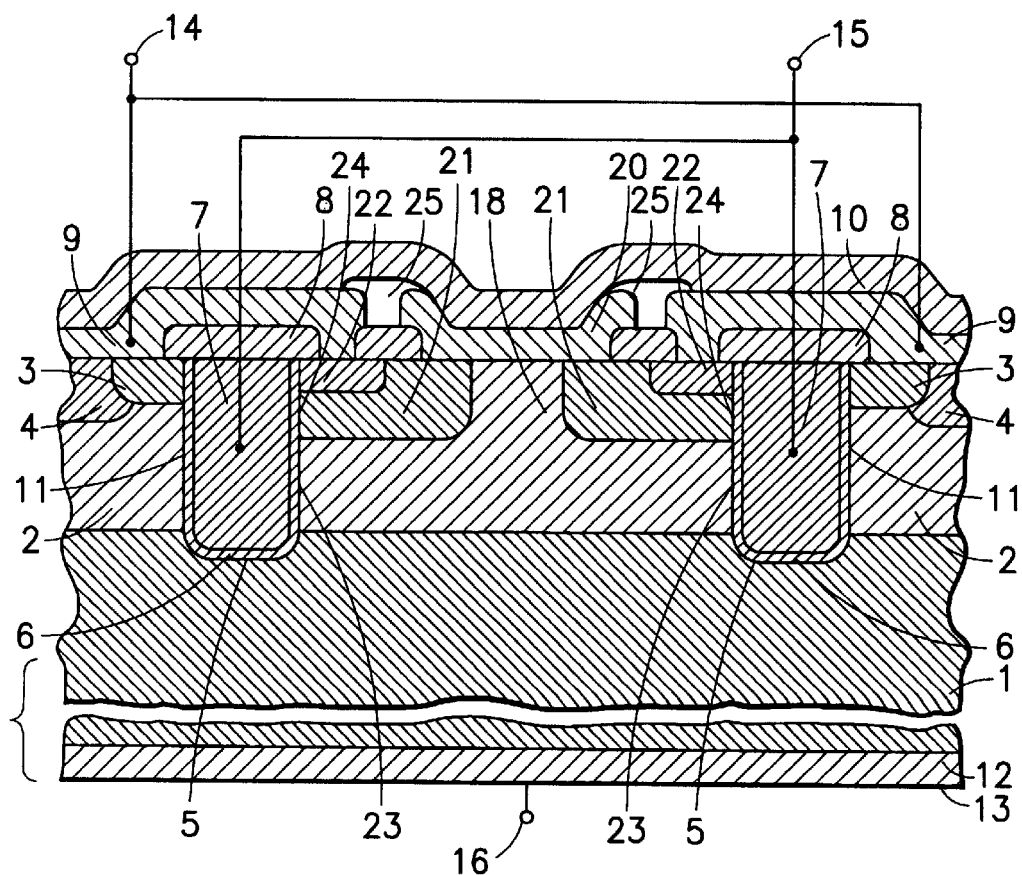
FIG. 12 is a sketch of a fifth embodiment of the trench structure with integrated turn-on resistance $R_p$.

FIG. 12 shows another IGBT trench gate structure in which resistance $R_p$ is integrated into the semiconductor body, which makes an additional IGBT connection and the external resistance circuitry with $R_p$ unnecessary. This is realized by means of appropriate high-impedance resistance region 25 which, for example, is made of polysilicon and positioned between metallization 20 of p region 18 and metallization 9 or emitter 14. Again like designations correspond to similar elements and description is thus omitted.

Figure 13:
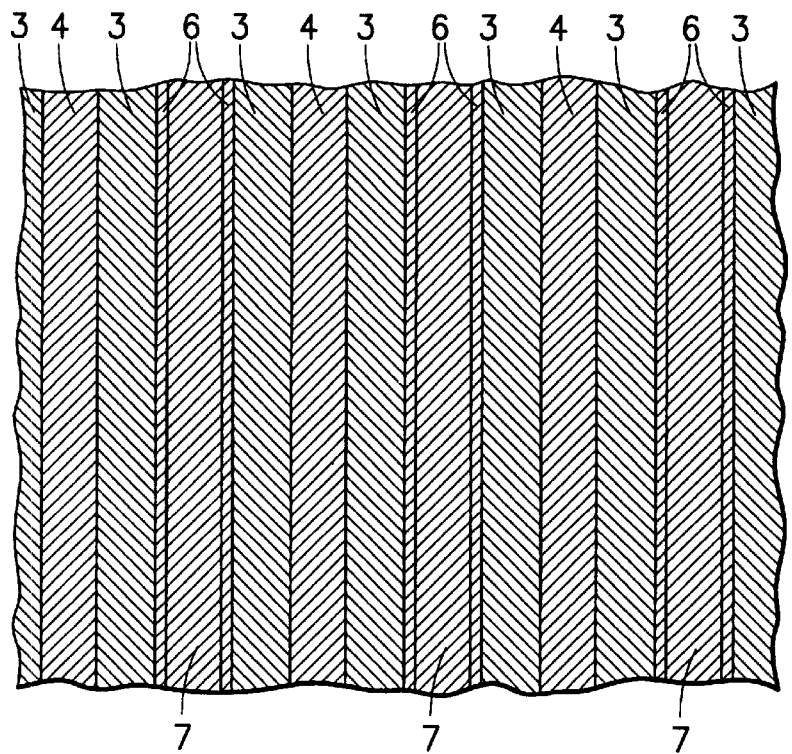
FIG. 13 shows a top view of an IGBT structure with striped design according to the prior art embodiment shown FIG. 1.

FIG. 13, representing the present state of the art, depicts a pure striped structure. The structure is shown in the silicon (without cover layers). Gate oxide layer 6 and n⁺source regions 3 flank polysilicon gate 7. Between n⁺source regions 3, p⁺bulk connection regions 4 are arranged.

Figure 14:
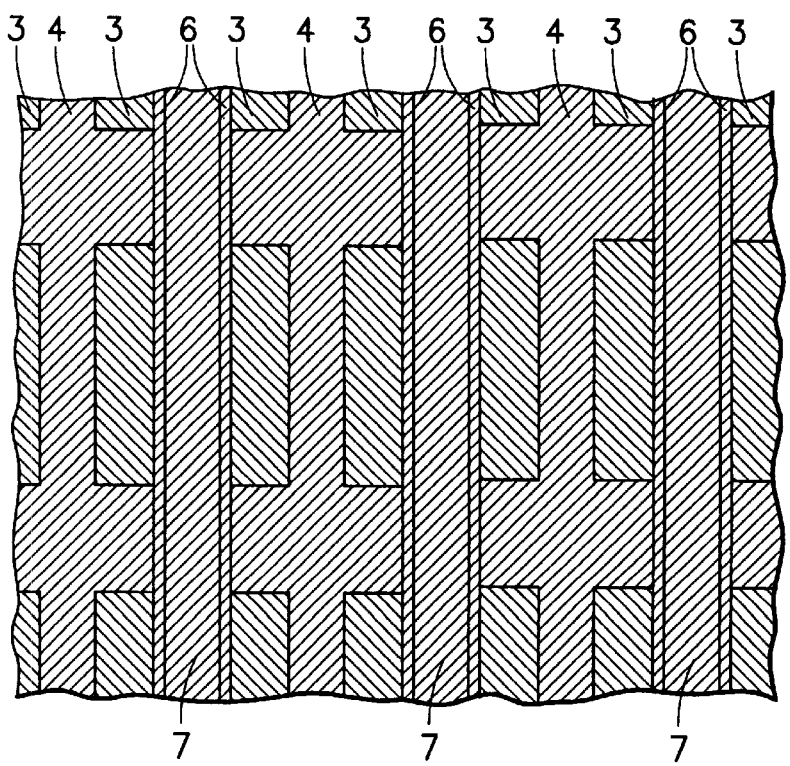
FIG. 14 shows another top view of an IGBT structure with striped design according to the prior art embodiment shown FIG. 1.

In FIG. 14 (also prior art) the striped structure of polysilicon gate 7 is formed in the same way. However n⁺source regions 3 are designed with interruptions defined by p⁺bulk connection regions 4

Figure 15:
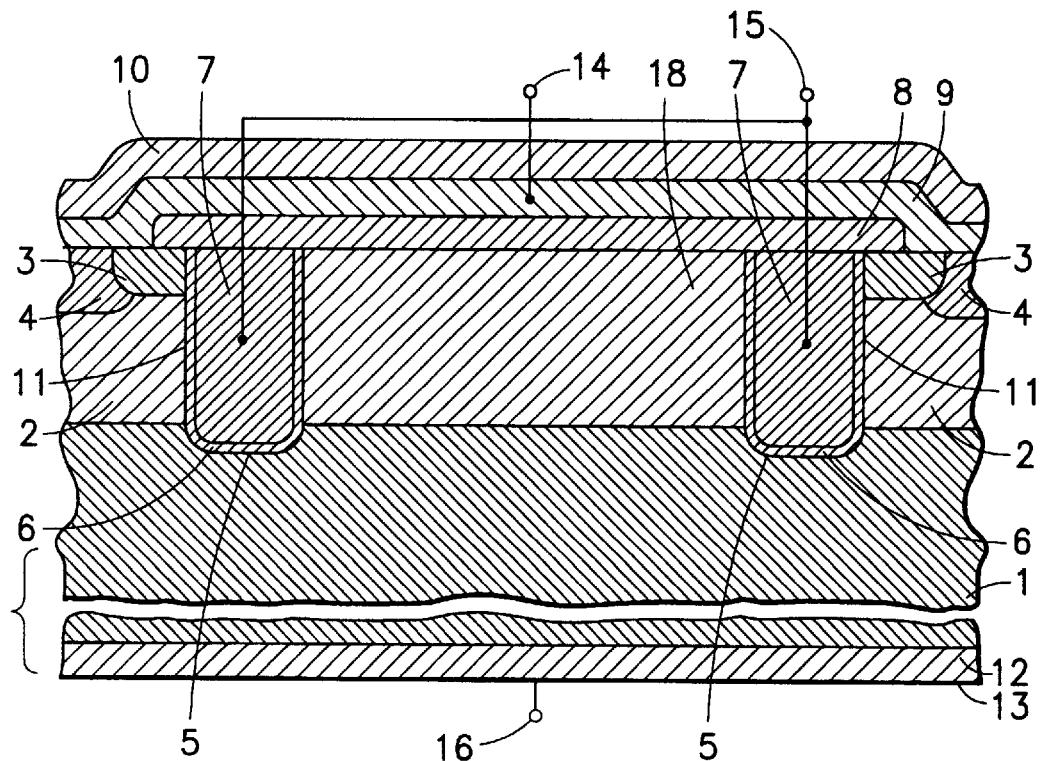
FIG. 15 shows a plan view of the simplest possible design according to the embodiment in FIG. 5 with a floating p region.

FIG. 15 shows in cross section the simplest possibility of an embodiment according to FIG. 5 with a floating p region. Floating here means that the entire p region 18 is covered with passivation layer 8. In contrast to FIG. 5 there is no connecting metallization 20 of p region 18. All other elements of this drawing were already described in connection with FIG. 5.

Figure 16:
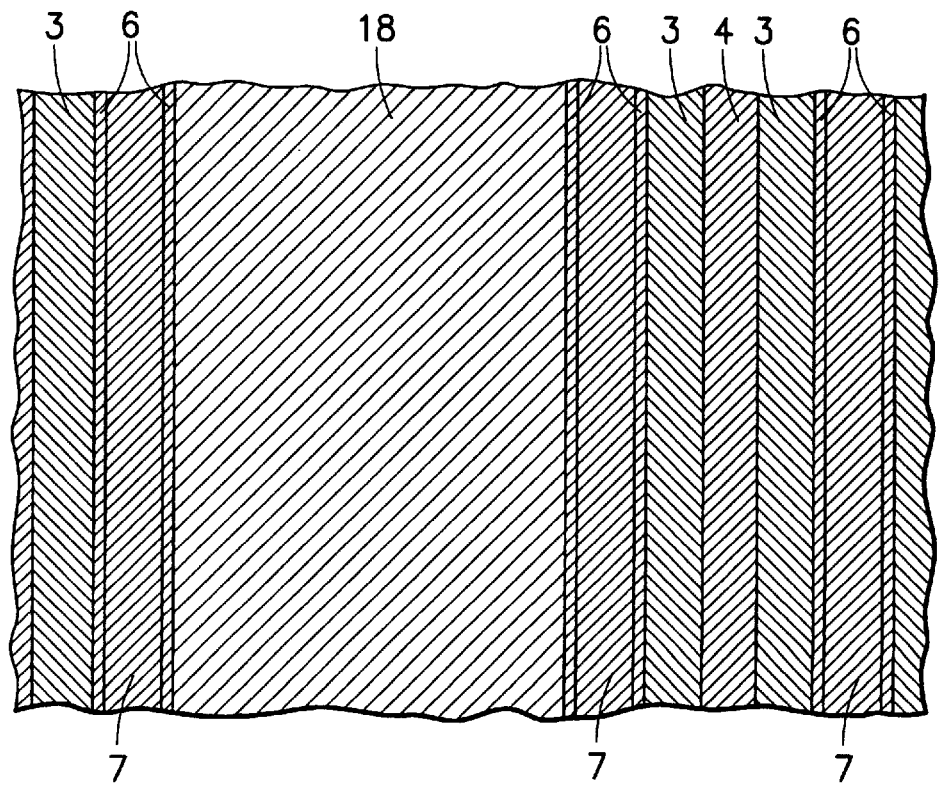
FIG. 16 shows a top view of the trench gate structure in a striped form according to any one of the embodiments of this invention.

FIG. 16 demonstrates the difference in the position of the diffusion layers. In between adjacent polysilicon gates 7 and insulators 6 of a single IGBT, p region 18 is disposed. On the outside of gates 7, and in between neighboring IGBTs disposed within a semiconductive device, a combination of n⁺source 3, p⁺bulk and then another n⁺source is disposed.

Figure 17:
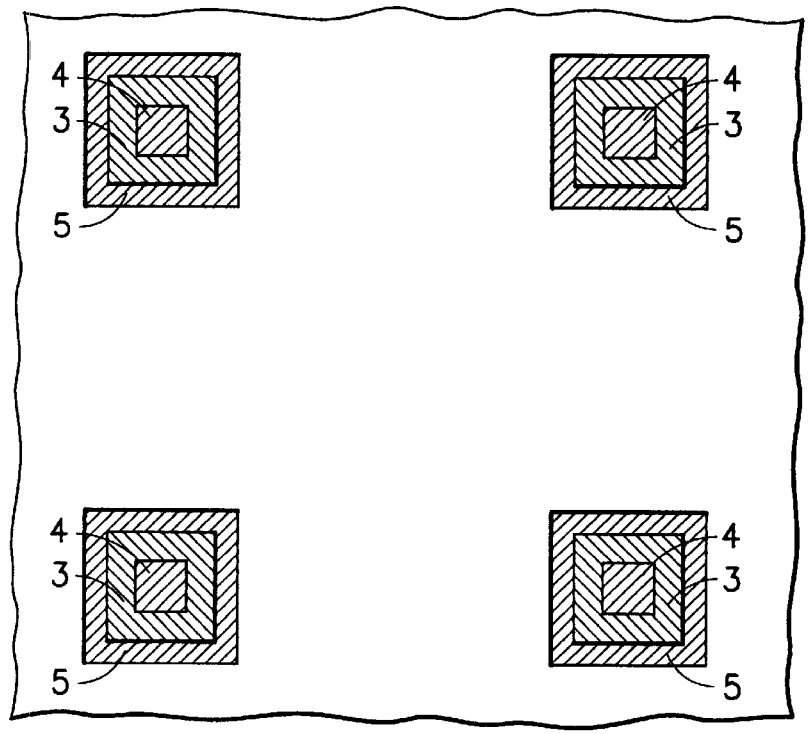
FIG. 17 is a plan view of an island structure of the trench gate cells for the embodiment in FIG. 5 or FIG. 15.

FIG. 17 shows an island structure of the trench gate cells. The individual trench gate cells according to the invention are separated from each other electrically and in space. The drawing shows a partial view of the design with four individual cells although a greater number of cells and not necessarily even number of cells can be used. In principle, they are from p⁺bulk connection region 4, n⁺source region 3 and trench 5. The individual trenches are insulated against each other. The spaces between the trench gate cells are either insulator regions 17, p doping regions 18 or substrate regions 1.

Figure 18:
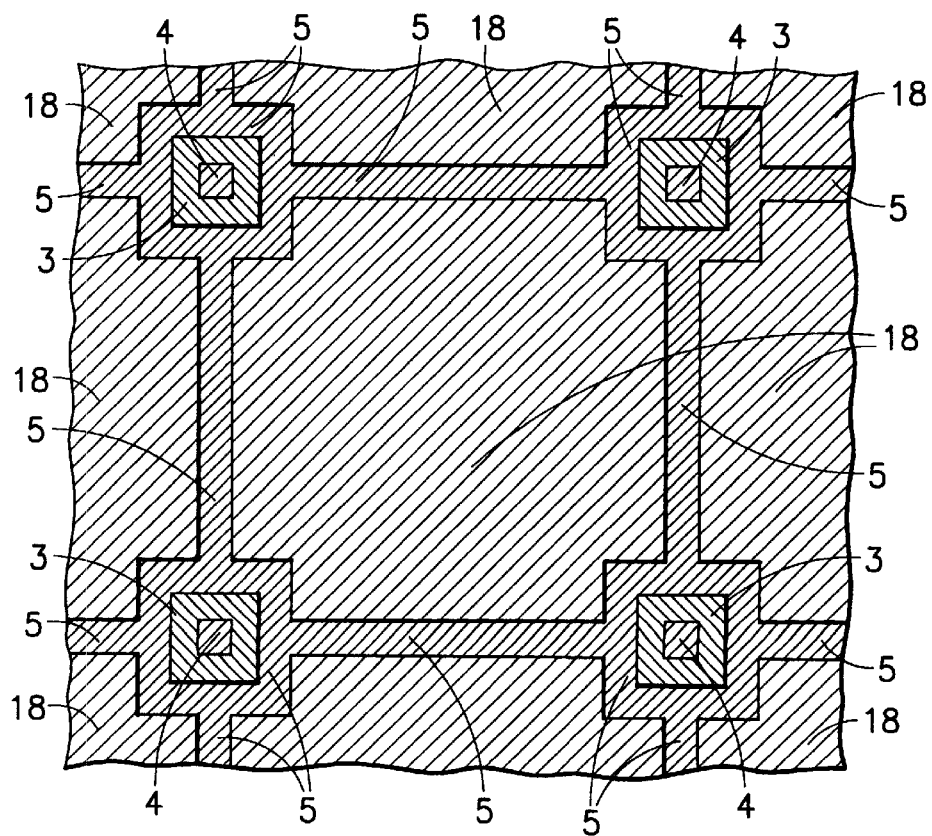
FIG. 18 is a plan view of a possible version of the invention for the electrical connection of the structure according to the embodiment in FIG. 17.

FIG. 18 shows a potential version, according to the invention, of the electrical connection in accordance with FIG. 17. Connecting trench regions (5-dotted) by means of buried regions can be done during the same process that produces the trench. The presented implementation of the inventive idea of producing electrical connections between the individual trenches is a technologically optimal solution in terms of fabrication and is relatively cost-effective.

The inventive solution offers room in the semiconductor volume for the trench structure produced. It is technologically possible to introduce polysilicon conducting lines for the electrical contacting between the trenches (5-dotted). Gate oxide 6 in trench 5 and passivation 8 completely insulate the buried conducting lines. The electrical connections according to the invention can be produced with otherwise random cell structures (e.g. squares, rectangles or hexagons).

Figure 19:
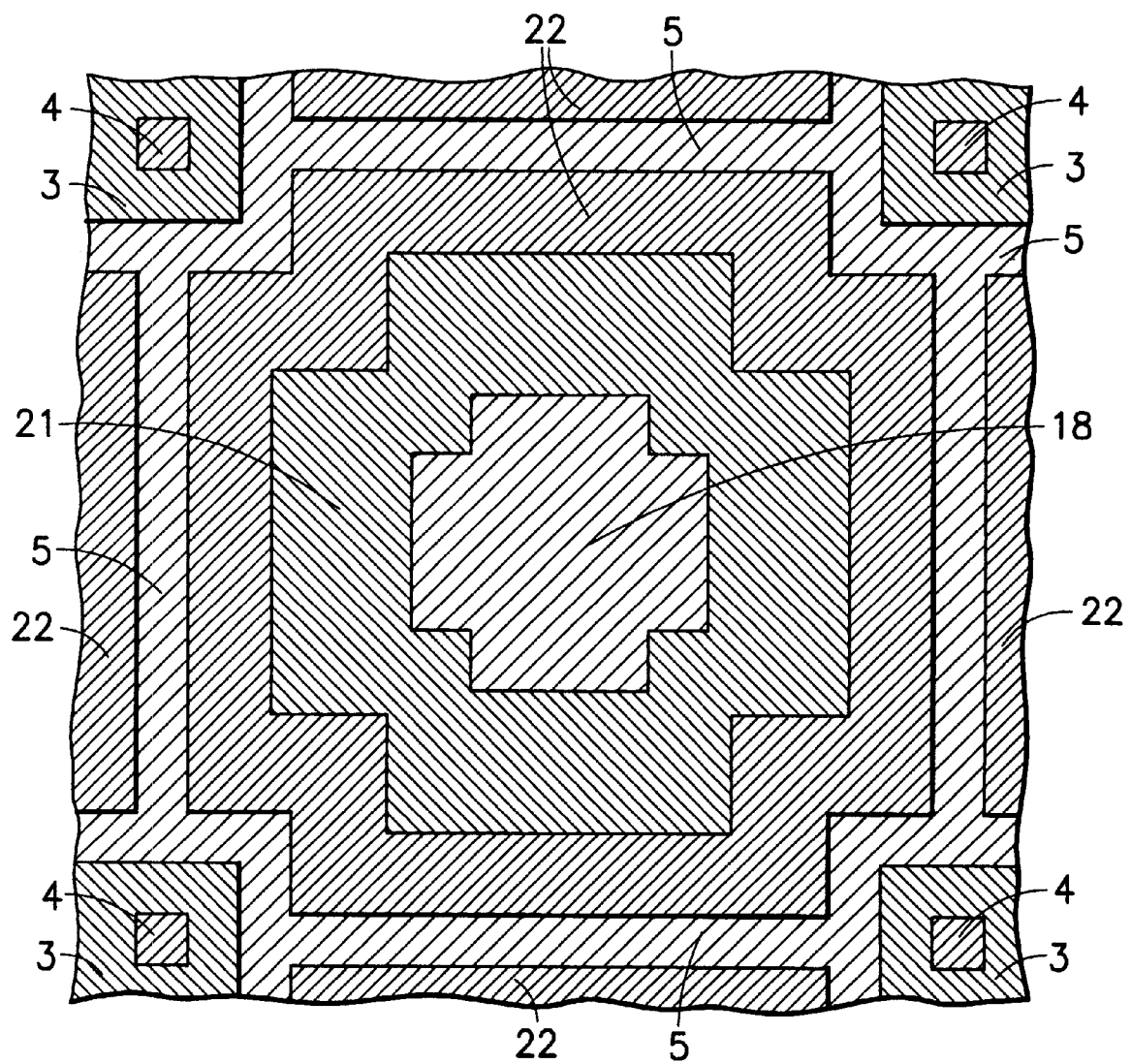
FIG. 19 shows a top view of the trench gate structure according to the embodiment in FIGS. 10 or 12 with a cell-shaped design.

FIG. 19 demonstrates the possibility of realizing very complex arrangements. This structure contains in its p region (18-source) n tub (21, bulk) which in turn contains p⁺drain region. The other elements of the drawing have already been explained.

As an alternative, the connections between the spatially and electrically separated trench gate structures can also be realized by means of metal or polysilicon conducting lines on the silicon surface. However, this requires additional conducting lines and insulation layers or structured connection regions, which can be formed, for example, by finger structures in metallization.

Advantageous embodiments of a circuit according to the invention result from the dimensions named below, which are hereby published as examples. Trench structures 5 should have a trench depth from 1 $\mu$m to 15 $\mu$m and a trench width between 1 $\mu$m and 4 $\mu$m, where the spacing of the trench structures on the side with the vertical MOS structure, i.e. the MOS transistor connection region 3 and 4, depends on the lithograph level used to realize emitter 14.

The spacing of trench structures 5 on the other side, the side with the subsequent insulator 17, doping 18 or substrate I region, is determined by the given blocking voltage class of the TIGBT and its trench geometry.

For a 1200 V TIGBT with a p bulk region 2 of 3 $\mu$m to 5 m, the trench depth should be 4 $\mu$m to 6 $\mu$m and the trench width 1 $\mu$m to 2 $\mu$m, where the spacing of the trench structures on the side with the vertical MOS structure, i.e. the MOS transistor connection region 3 and 4, is between 4 $\mu$m and 10 $\mu$m wide and the spacing of the trench structures on the side with the subsequent insulator 17, doping 18 or substrate region 1, is between 15 $\mu$m and 25 $\mu$m.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor element having an IGBT comprising:
   a substrate of a first conductivity type having a first and second side opposing one another;
   an emitter terminal;
   two trenches extending from said emitter terminal toward said first side of said substrate, each trench having a gate and an insulator disposed around said gate;
   said trenches each having first and second opposing sides;
   said trenches defining a cavity between said first sides of said trenches;
   said cavity being filled with a material of said first conductivity type;
   a collector region of a second conductivity type disposed on said second side of said substrate;
   two bulk regions of said second conductivity type each disposed on said first side of said substrate and each further disposed on respective second sides of each of said trenches;
   two source regions of said first conductivity type each disposed on said bulk region and further disposed on respective second sides of each of said trenches;

two bulk connection regions of said second conductivity type each disposed on a respective bulk region and each further disposed adjacent to a respective source region; and said source and bulk connection regions being electrically connected through said emitter terminal.

2. A semiconductor element having an IGBT as in claim 1 wherein:

said trenches are arranged in a format that is one of stripes, islands, and lattices.

3. A semiconductor element having an IGBT comprising:

a substrate of a first conductivity type having first and second opposing sides;

an emitter terminal;

two trenches extending from said emitter terminal toward said first side of said substrate, each trench having a gate and an insulator disposed around said gate;

said trenches each having first and second opposing sides;

said trenches defining a cavity between said first sides of said trenches;

said cavity being filled with an insulator;

a collector region of a second conductivity type disposed on said second side of said substrate;

two bulk regions of said second conductivity type each disposed on said first side of said substrate and each further disposed on respective second sides of each of said trenches;

two source regions of said first conductivity type each disposed on said bulk regions and each further disposed on respective second sides of each of said trenches;

two bulk connection regions of said second conductivity type each disposed on a respective bulk region and each further disposed adjacent to a respective source region; and said source and bulk connection regions being electrically connected through said emitter terminal.

4. A semiconductor element having an IGBT as in claim 3 wherein:

said trenches are arranged in a format that is one of stripes, islands, and lattices.

5. A semiconductor element having an IGBT comprising:

a substrate of a first conductivity type having a first and second side opposing one another;

an emitter terminal;

two trenches extending from said emitter terminal toward said first side of said substrate, each trench having a gate and an insulator disposed around said gate;

said trenches each having first and second opposing sides;

said trenches defining a cavity between said first sides of said trenches;

said cavity being filled with a material of a second conductivity type;

an electrical potential connected to said cavity;

a collector region of a second conductivity type disposed on said second side of said substrate;

two bulk regions of said second conductivity type each disposed on said first side of said substrate and each further disposed on respective second sides of each of said trenches;

two source regions of said first conductivity type each disposed on a respective bulk region and each further disposed on respective second sides of each of said trenches;

two bulk connection regions of said second conductivity type each disposed on a respective bulk region and each further disposed adjacent to a respective source region; and said source and bulk connection regions being electrically connected through said emitter terminal.

6. A semiconductor element having an IGBT as in claim 5 wherein:

said electrical potential is connected to said cavity through a resistance.

7. A semiconductor element having an IGBT as in claim 6 wherein said resistance comprises:

at least two MOSFETs of different channel type; and gates of said MOSFETs being coupled to said gate of said IGBT.

8. A semiconductor element having an IGBT as in claim 5 wherein:

said trenches are arranged in a format that is one of stripes, islands, and lattices.

9. A semiconductor element having an IGBT comprising:

a substrate of a first conductivity type having first and second opposing sides;

an emitter terminal;

two trenches extending from said emitter terminal toward said first side of said substrate, each trench having a gate and an insulator disposed around said gate;

said trenches each having first and second opposing sides;

said trenches defining a cavity between said first sides of said trenches;

said cavity including at least one first source region of a second conductivity type disposed upon said first side of said substrate, at least one tub of said first conductivity type disposed upon said first source region, and at least one drain of said second conductivity type disposed upon said tub;

said tub and said drain being electrically connected through a metallization material;

said drain being further coupled to said emitter;

two bulk regions of said second conductivity type each disposed on said first side of said substrate and each further disposed on respective second sides of each of said trenches;

two second source regions of said first conductivity type each disposed on a respective bulk region and each further disposed on respective second sides of each of said trenches;

two bulk connection regions of said second conductivity type each disposed on a respective bulk region and each further disposed adjacent to a respective second source region;

said second source region and said bulk connection regions electrically connected through said emitter terminal; and a collector region of said second conductivity type disposed on said second side of said substrate.

10. A semiconductor element having an IGBT as in claim 8 where a resistance is coupled to said metallization material.

11. A semiconductor element having an IGBT as in claim 10 where said resistance includes:

a MOSFET coupled to said metallization material, said emitter, a resistance, and said gate of said IGBT.

12. A semiconductor element having an IGBT as in claim 9 wherein:

said trenches are arranged in a format that is one of stripes, islands, and lattices.

13. A semiconductor element having an IGBT comprising:

a substrate of a first conductivity type having a first and second side opposing one another;

an emitter terminal;

two trenches extending from said emitter terminal toward said first side of said substrate, each trench having a gate and an insulator disposed around said gate;

said trenches each having first and second opposing sides;

said trenches defining a cavity between said first sides of said trenches;

said cavity being filled with a material of a second conductivity type;

a resistance coupled to said cavity region, said resistance including at least two MOSFETs of different channel type;

gates of said MOSFETs being coupled to said gate of said IGBT;

a collector region of said second conductivity type disposed on said second side of said substrate;

two bulk regions of said second conductivity type each disposed on said first side of said substrate and each further disposed on respective second sides of each of said trenches;

two source regions of said first conductivity type each disposed on a respective bulk region and each further disposed on respective second sides of each of said trenches;

two bulk connection regions of said second conductivity type each disposed on a respective bulk region and each further disposed adjacent to a respective source region; and said source and bulk connection regions being electrically connected through said emitter terminal.

14. A semiconductor element having an IGBT as in claim 13 wherein:

said trenches are arranged in a format that is one of stripes, islands, and lattices.

* * * * *